(12) United States Patent
Chang

(10) Patent No.: US 6,474,477 B1
(45) Date of Patent: Nov. 5, 2002

(54) CARRIER ASSEMBLY FOR SEMICONDUCTOR IC (INTEGRATED CIRCUIT) PACKAGES

(76) Inventor: Ching T. Chang, 1074 E. Walnut St., Westerville, OH (US) 43081

( * ) Notice: Subject to any disclaimer, the term of this patent is extended or adjusted under 35 U.S.C. 154(b) by 0 days.

(21) Appl. No.: 09/847,389

(22) Filed: May 2, 2001

(51) Int. Cl.[7] .............................................. B65D 85/00
(52) U.S. Cl. ...................... 206/725; 206/509; 206/561; 206/564
(58) Field of Search ................................. 206/722, 724, 206/725, 505, 508, 509, 561, 564, 713, 714

(56) References Cited

U.S. PATENT DOCUMENTS

| | | | |
|---|---|---|---|
| 5,073,116 A | * 12/1991 | Beck, Jr. | 206/724 |
| 5,109,980 A | 5/1992 | Matsuoka | |
| 5,131,535 A | 7/1992 | O'Connor | |
| 5,203,454 A | 4/1993 | Small | |
| 5,246,129 A | 9/1993 | Small | |
| 5,310,076 A | 5/1994 | Burton | |
| 5,418,692 A | * 5/1995 | Nemoto | 174/52.1 |
| 5,547,082 A | 8/1996 | Royer | |
| 5,636,745 A | * 6/1997 | Crisp et al. | 206/509 |
| 5,794,783 A | 8/1998 | Carter | |
| 5,794,784 A | * 8/1998 | Murphy | 206/511 |
| 5,848,702 A | 12/1998 | Pakeriasamy | |
| 5,957,293 A | 9/1999 | Pakeriasamy | |
| 5,971,156 A | 10/1999 | Slocum | |
| 6,036,023 A | * 3/2000 | Pfahnl et al. | 206/714 |
| 6,071,056 A | 6/2000 | Hollowell | |
| 6,079,565 A | 6/2000 | Walsh | |
| 6,082,547 A | 7/2000 | Nentl | |
| 6,389,687 B1 | * 5/2002 | Glenn et al. | 29/740 |

OTHER PUBLICATIONS

Jedec Design Standard, Design Requirements for Outlines of Solid State and Related Products, Jedec.
Standard, No. 95–1, Section 10, Nov. 1997, Revision C, Generic Matrix Tray for Handling and Shipping.
Jedec Solid State Products Engineering Council, USA.

* cited by examiner

Primary Examiner—Shian Luong
(74) Attorney, Agent, or Firm—Thomas S. Baker, Jr.

(57) ABSTRACT

A semiconductor chip package carrier assembly is provided with a tray component having depending support legs that support multiple semiconductor chip packages in open package pockets, with a cover component having depending clamping legs in open package pockets that register with the tray component open package pockets, and with snap latches that securely and removably join the cover component to the tray component in a manner whereby each contained semiconductor chip package is locked by the depending support legs and depending clamping legs in a fixed position with respect to the tray and cover components throughout all spatial orientations of the assembly.

8 Claims, 4 Drawing Sheets

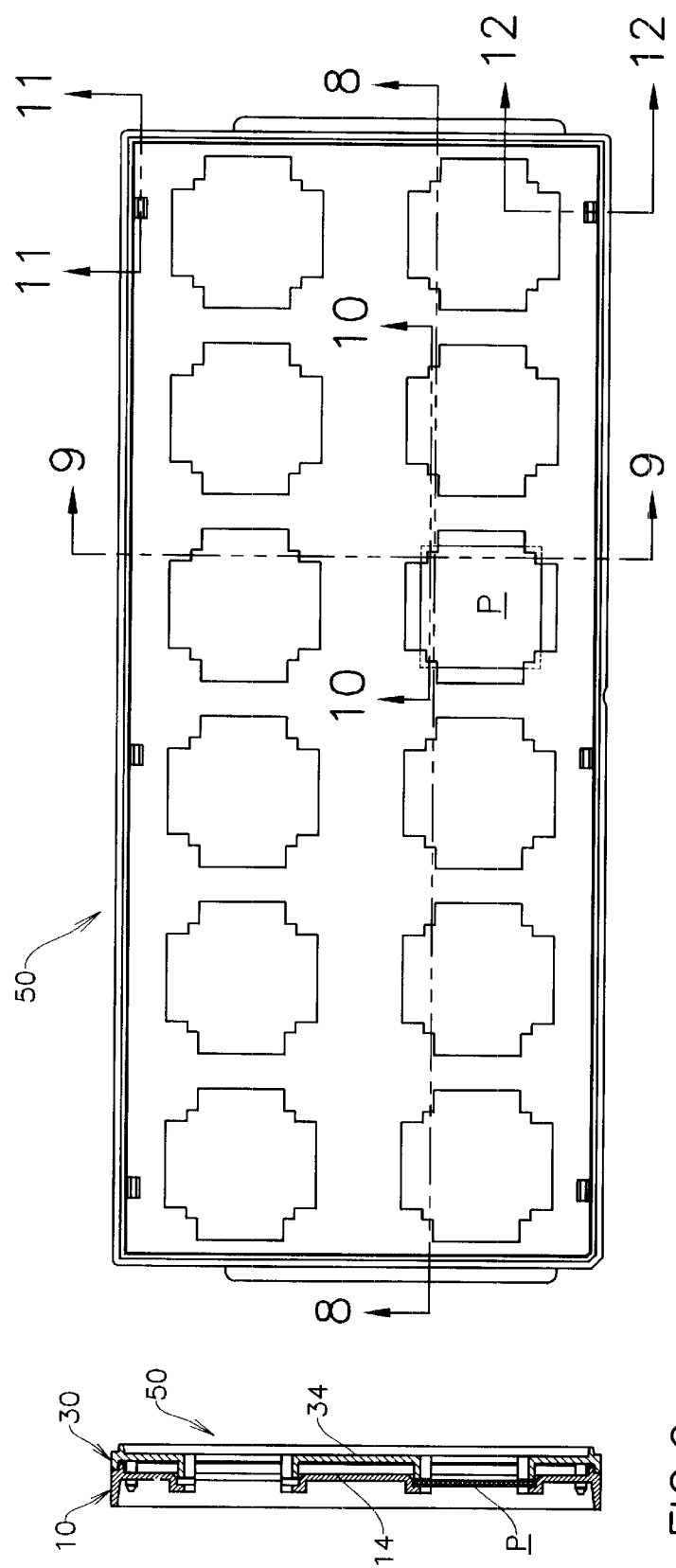
FIG. 7
FIG. 9
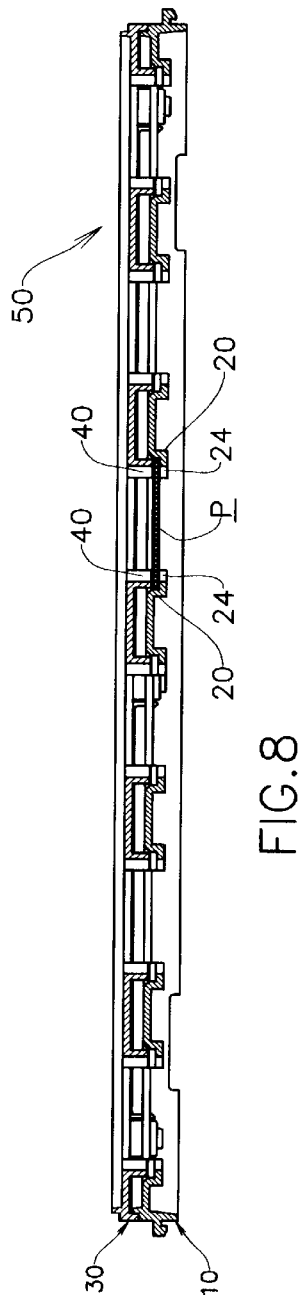
FIG. 8

CARRIER ASSEMBLY FOR SEMICONDUCTOR IC (INTEGRATED CIRCUIT) PACKAGES

CROSS-REFERENCES

None.

FIELD OF THE INVENTION

The present invention relates generally to the manufacture of semiconductor IC packages such as are utilized in different computer electronic circuit applications, and particularly concerns a semiconductor IC package carrier that may be used advantageously in connection with various semiconductor integrated circuit manufacturing and testing operations to obtain increases in operations efficiencies and reductions in operations costs.

BACKGROUND OF THE INVENTION

Known carriers for transporting and processing semiconductor IC packages between and within different manufacturing and testing operations, and particularly those carriers qualifying as JEDEC (Joint Electron Device Engineering Council) standard trays, are unnecessarily restricted to relatively slow lateral movement during manufacturing and testing process operations, are unnecessarily restricted to relatively horizontal carrier orientations because of inadequate individual semiconductor IC package retention, and can also unnecessarily contribute to unwanted semiconductor IC package damage arising out of inadvertent carrier handling accidents. Such limitations lead to relatively low device manufacturing and testing efficiencies and consequential relatively high manufacturing and testing costs. See U.S. Pat. No. 5,794,783 pertaining to a "Die-level Burn-in and Test Flipping Tray" invention, issued May 1, 2001 in the name of Carter, and assigned to Intel Corporation for details of a representative JEDEC-standard general matrix tray which is subject to such shortcomings.

Accordingly it is a principal object of the present invention to provide a semiconductor IC package carrier that, when utilized in connection with various device manufacturing and testing operations, significantly improves processing efficiency and also significantly reduces related manufacturing and testing costs.

Other objects and advantages of the present invention will become apparent during consideration of the detailed descriptions, drawings, and claims which follow.

SUMMARY OF THE INVENTION

The semiconductor IC package carrier assembly of the present invention is basically comprised of a tray component having a deck surface provided with a matrix of multiple integrally-molded package pockets, a separate cover component having a deck with a matrix of multiple integrally-molded package pockets whose positions respectively register with the tray component package pockets when assembled to the tray component, and multiple latch components that are each comprised of a latch cutout receptacle element molded integral with the assembly tray component and of a snap latch element that is molded integral with the cover component and that co-operates with a respective latch cutout receptacle element when the carrier tray and cover components are properly assembled. The invention tray component is provided with multiple, integrally-molded depending IC package support legs associated with each tray component package matrix pocket, and the cover component is provided with correspondingly positioned multiple, integrally-molded depending IC package clamp legs that are associated with each cover component package matrix pocket and that each co-operatively nest with and within a respective one of the tray component depending IC package support legs when the tray component and the cover component are assembled.

With semiconductor IC packages properly positioned in the tray component package matrix pockets and supported by the tray component depending support leg elements, and with the integrally-molded latch elements of the tray component and of the cover component being co-operatively engaged, the cover component package matrix pocket depending clamp legs function to rigidly clamp the contained semiconductor IC packages in fixed positions relative to the carrier assembly and thereby enable the carrier assembly and contained semiconductor chip packages to be fully rotated about each possible rotational axis and moved at relatively high lateral velocities without ensuing displacement of any chip package relative to the carrier assembly.

A tool that may be either manually or mechanically operated is provided for releasing the carrier assembly engaged latch elements from secured engagement with each other to thereby facilitate complete disengagement of the carrier assembly cover component from the carrier assembly tray component and facilitate subsequent unloading of the contained semiconductor IC packages from the tray component.

BRIEF DESCRIPTION OF THE DRAWINGS:

FIG. 7 is a top plan view of the components of FIGS. 1 and 4 assembled to comprise a preferred embodiment of the semiconductor IC package carrier assembly of the present invention;

FIG. 8 is a section view taken at line 8—8 of FIG. 7;

FIG. 9 is a section view taken at line 9—9 of FIG. 7;

DETAILED DESCRIPTION

Figure 1:
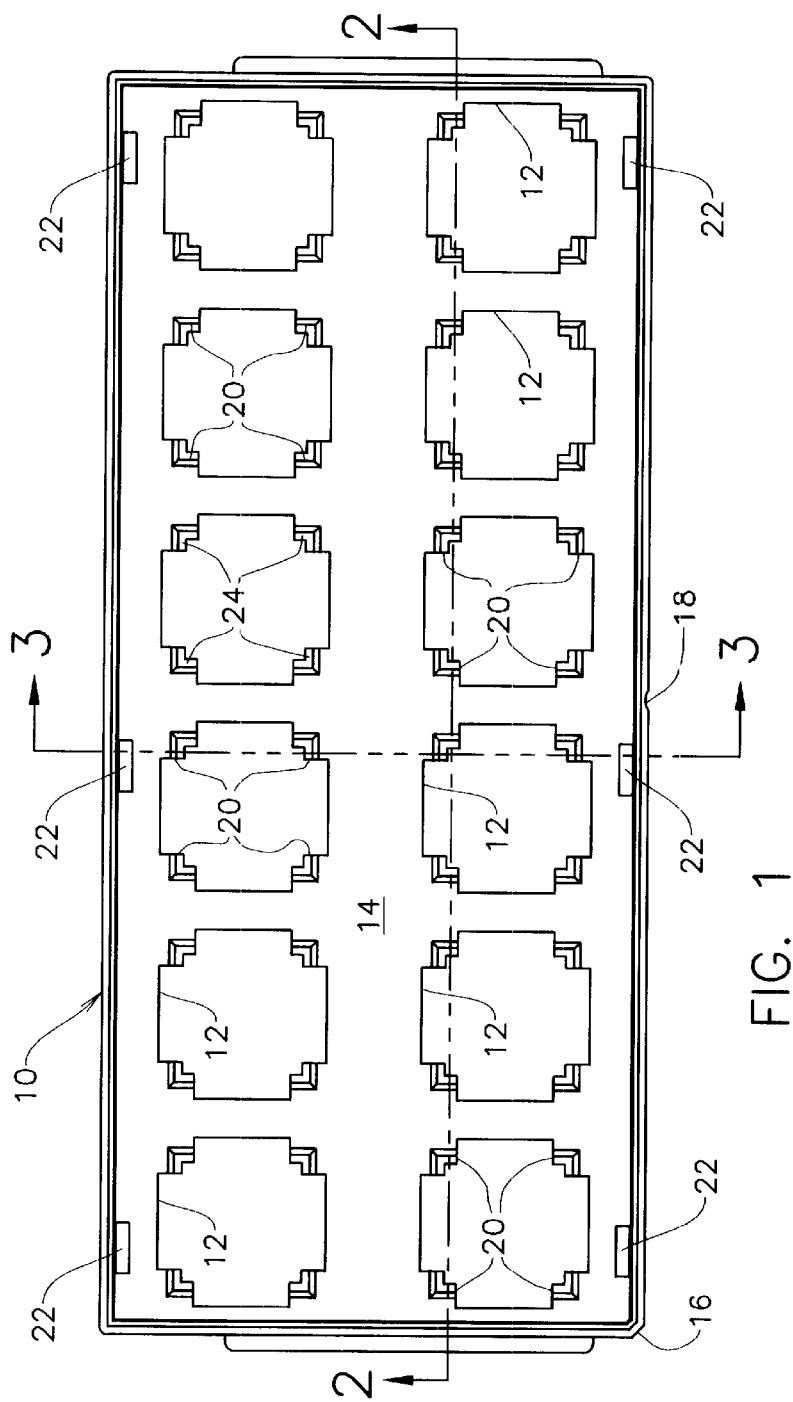
FIG. 1 is a top plan view schematically illustrating a preferred tray component utilized in the practice of the present invention.
Figure 2:
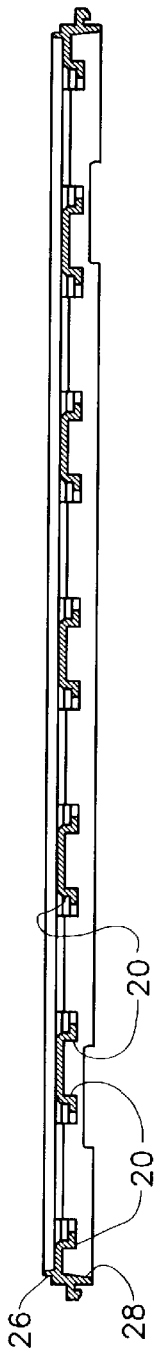
FIG. 2 is a longitudinal section view taken along line 2—2 of FIG. 1.
Figure 3:
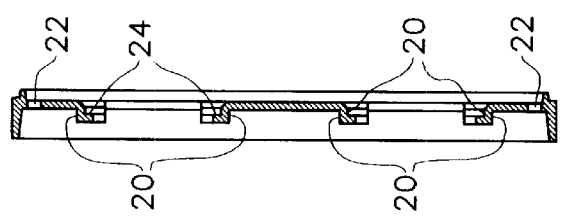
FIG. 3 is a transverse sectional view taken along line 3—3 of FIG. 1.

FIGS. 1 through 3 illustrate the tray component 10 of the present invention. Such invention component is preferably configured to meet the requirements of JEDEC (Joint Electron Device Engineering Council) Design Standard No. 95-1 for generic matrix trays for handling and shipping different semiconductor IC packages by having specified overall height, width, and length dimensions, by being provided with specified matrix density and positioning of the included package matrix pockets 12 that are molded integrally within tray component deck 14, and by including the required pin-one orientation chamfer 16 and tray orientation scallop 18 features. Tray component 10, in the configuration illustrated in FIG. 1, has six matrix columns of open pockets 12, each column having two rows, but can have other numbers of columns of open pockets and other numbers of rows of open pockets in each column depending upon the size and shape of the semiconductor IC packages that are to be carried.

Also molded integrally within deck 14 of tray component 10 are four depending support legs 20 for each open matrix pocket 12, and the illustrated six latch cutout receptacle elements 22. The particular number and positions of latch receptacle elements 22 included in a tray component 10 corresponds to the number and positions of the snap latch elements molded in the invention cover component, and usually varies with the overall width and length of the tray and cover components, with four corner-positioned snap latches generally being the required minimum number. Further, each depending support leg 20 provided in tray component 10 is provided with an integral lip-like terminating corner shelf 24 upon which a co-operating installed semiconductor chip package corner will rest for support and clamping purposes.

Tray component deck 14 has an integrally molded peripheral recess 26 formed on its top side and an integrally molded downwardly extending peripheral projection 28 formed on its underside. Trays may be stacked by having a downwardly extending peripheral projection 28 of an upper tray received in a peripheral recess 26 formed on the top side of a lower tray.

Figure 4:
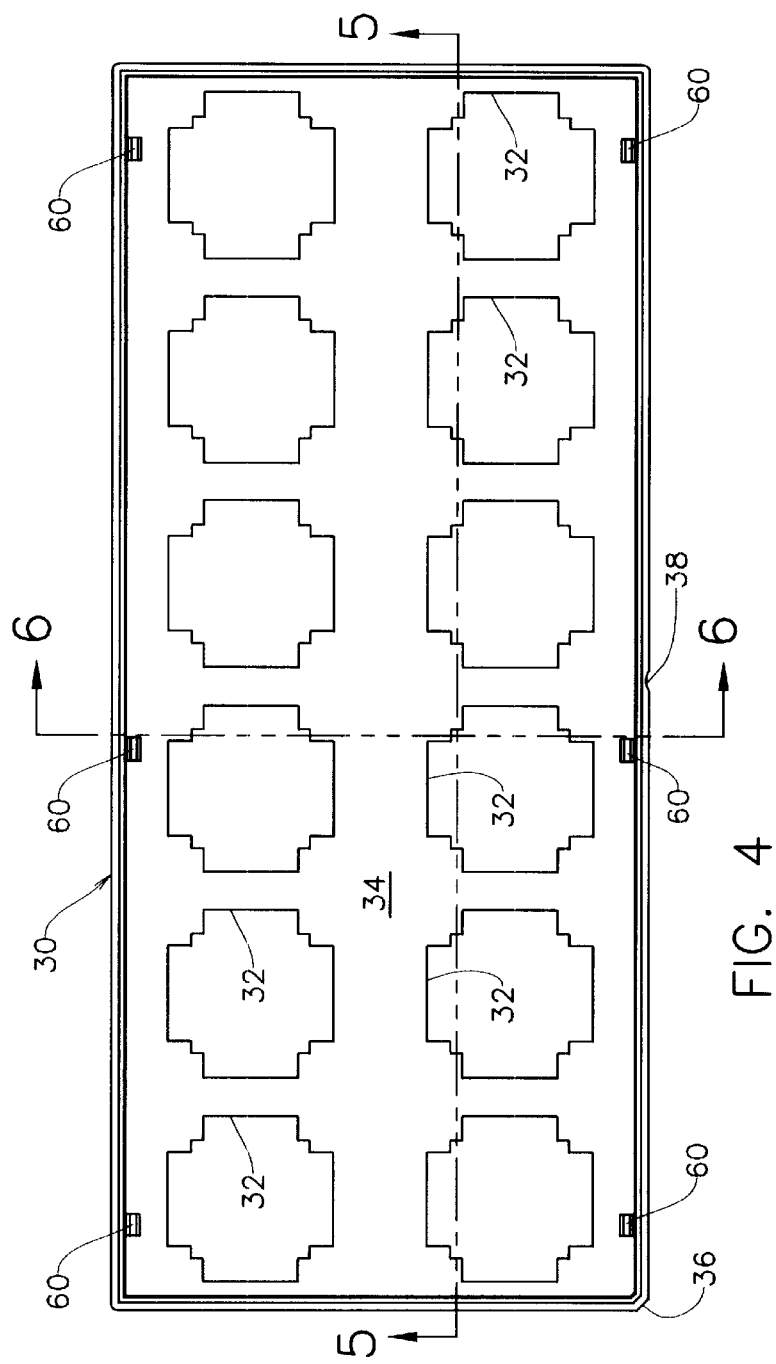
FIG. 4 is a top plan view schematically illustrating a preferred cover component utilized in the practice of the present invention.
Figure 5:
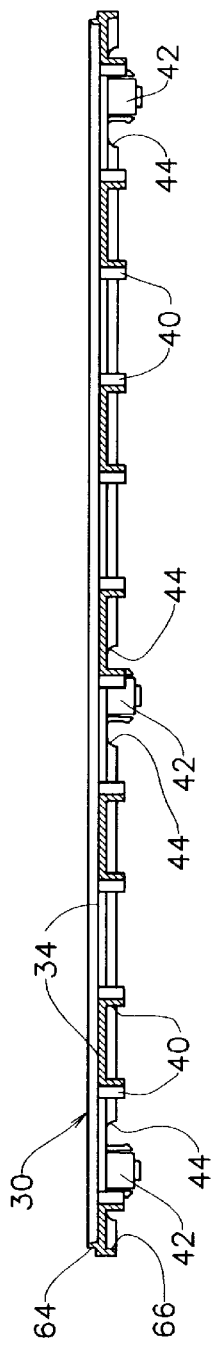
FIG. 5 is a longitudinal section view taken along line 5—5 of FIG. 4.
Figure 6:
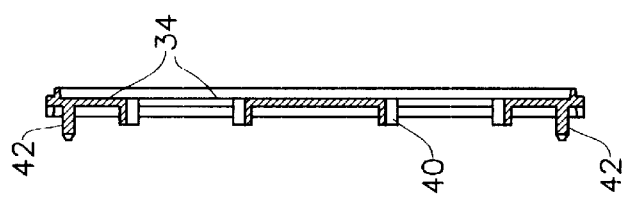
FIG. 6 is a transverse section view taken along line 6—6 of FIG. 4.
Figure 10:
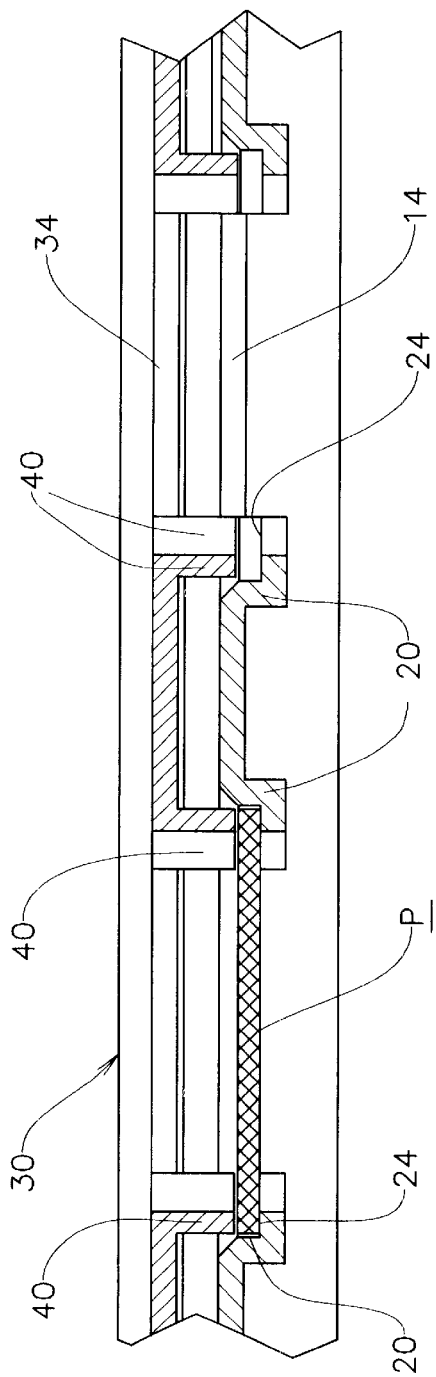
FIG. 10 is an enlarged partial section view taken at line 10—10 of FIG. 7.

FIGS. 4 through 6 illustrate the cover component 30 of the present invention. Such invention component is preferably configured to have open pockets 32 molded integrally within cover component deck 34, and also preferably includes a JEDEC-required pin-one orientation chamfer 36 and cover orientation scallop 38 features. Cover component 30, in the configuration illustrated in FIG. 4, has, like tray component 10, six columns of matrix pockets 32 that each have two rows so as to obtain registration of open pockets 32 with matrix package pockets 12 when the tray and cover components are properly assembled. Also molded integrally with deck 34 of cover component 30 are four depending clamping legs 40 for each open pocket 32, and the six snap latch elements designated 42. The particular number and positions of snap latch elements 42 included in a cover component 30 corresponds to the number and positions of the latch receptacle elements 22 molded in the invention tray component. Further, each depending clamping leg 40 provided in assembly cover component 30 is positioned to slidably nest within a respective support leg 20 in tray component 10. See FIG. 10. Also, cover component 30 is provided at the underside of its peripheral rim with an access undercut 44 associated with each snap latch element 42. Such access undercuts facilitate the insertion of a assembly release tool to effect the unlatching of cover component 30 from tray component 10 upon the completion of manufacturing and testing operations and preparatory to semiconductor IC package unloading.

Cover component deck 34 has an integrally molded peripheral recess 64 formed on its top side and an integrally molded downwardly extending peripheral projection 66 formed on its underside. A projection 66 on one cover is received on a cover peripheral recess 64 of a second cover when covers are stacked.

FIGS. 7 through 10 illustrate the tray component 10 of FIGS. 1 through 3 and the cover component 30 of FIGS. 4 through 6 properly assembled to form a preferred embodiment of the semiconductor IC carrier assembly 50 of the present invention. Carrier assembly 50 typically contains a semiconductor chip package P loaded into each invention matrix package open pocket. For purposes of clarity of illustration, however, only one such semiconductor chip package P is shown schematically in each of FIGS. 7 through 10.

The length of each clamping leg 40 is formed such that when a semiconductor chip package P has been properly positioned on the lip-like corner shelves 24 within a pocket 12 of tray component 10, and cover component 30 is securely latched to tray component 10 by co-operating latch elements 22 and 42, the frictional resistance and latch bars bending stress resulting from the engagement of latch elements secure the carrier assembly 50 from separating, causing package P to be securely locked between the surface of clamping legs 40 on the cover component and the shelves 24 on the tray component, in fixed positions relative to assembly 50, thereby permitting manufacturing operations to be effectively accomplished on the packages P without requiring that the carrier assembly 50 have any particular orientation such as a horizontal orientation or particular operational movement speed restriction.

Figure 12:
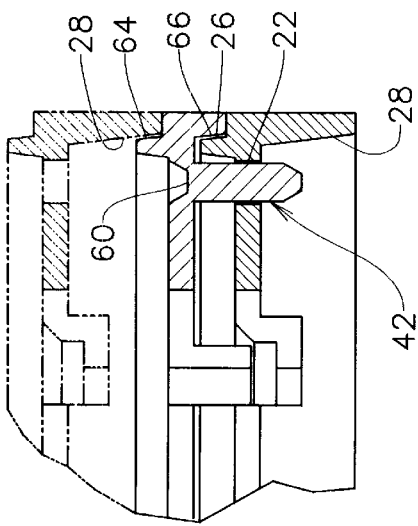
FIG. 12 is a section view similar to FIG. 11 but taken along line 12—12 of FIG. 7.
Figure 11:
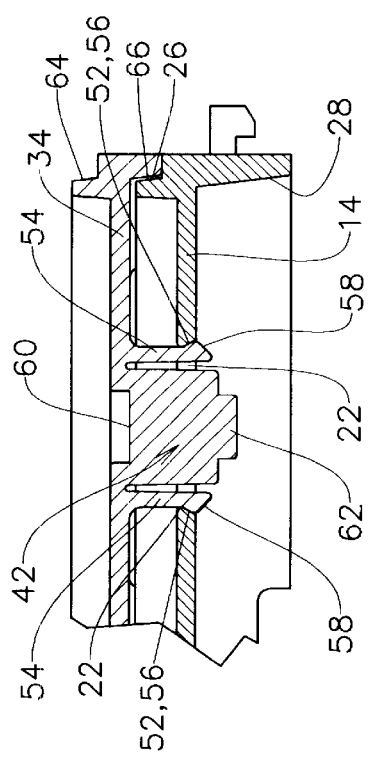
FIG. 11 is a partially-sectioned enlarged elevation view taken at line 11—11 of FIG. 7 and illustrating a representative latch element of the cover component of FIGS. 4 through 6 co-operating with a latch cutout receptacle element of the tray component of FIGS. 1 through 3.

FIGS. 11 and 12 more clearly illustrate a preferred construction of co-operating latch components 22 in tray component 10 and 42 in cover component 30. Each latch receptacle 22 is an rectangular cutout integrally-molded in tray deck 14 and is provided with a chamfered lower opening edge 52. Each snap latch element 42 is integrally-molded in cover deck 34 and has a pair of spaced-apart latch bars 54 that are each provided with a nose taper 56 and an end taper 58. In their unengaged positions, the latch bars 54 of snap latches 42 are positioned so that their end tapers 58 contact the non-chamfered upper edges of latch receptacle cutouts 22 as cover 30 first contacts tray component 10 during assembly to tray component 10. Further downward movement of cover component 30 relative to tray component 10 then causes each latch bar 54 to be forced inwardly until nose tapers 56 are subsequently sprung outwardly by induced tensile and compressive stresses to engage the chamfered lower opening edges 52 of cutouts 22. The main body of each snap latch 42 is provided with an integrally molded recess 60 and an integrally molded boss 62 that has a lower extreme with a configuration that is complementary to the configuration of molded recess 60 to facilitate subsequent stacking of cover components only.

When a cover component 30 is attached to a tray component 10 to form a carrier assembly 50, cover peripheral projection 66 is received in tray peripheral recess 26. Also, when a pair of carrier assemblies 50 are stacked, tray component peripheral projection 28 of one carrier assembly 50 is received in the cover component peripheral recess 64 of an adjacent carrier assembly.

To release snap latch elements 42 from engagement with latch receptacle openings 22 when separating cover component 30 from engagement with tray component 10, snap latch bars 54 of each snap latch element 42 are conveniently sprung toward each other to thus disengage nose tapers 56 from retention within latch receptacle opening 22.

Various changes may be made to the shape, size, and relative proportions of the various components and component elements illustrated herein without departing from the scope, meaning, or intent of the claims which follow.

I claim as my invention:

1. A carrier assembly for containment of semiconductor chip packages during manufacturing and testing operations, and comprising:

a tray component having a tray-orienting chamfer and a tray-orienting scallop, and having multiple semiconductor chip package open pockets formed in a tray deck that each have multiple integrally formed depending support legs that terminate in a semiconductor chip support shelves;

a cover component having a tray-orienting chamfer and a tray-orienting scallop, and having multiple semiconductor chip package pocket openings formed in a cover deck that are positioned in registration with said tray component package open pockets and that each have multiple integrally formed depending clamping legs positioned to nest within said tray component multiple semiconductor chip package open pocket depending support legs when said cover component is assembled to said tray component; and multiple snap latch components that are each comprised of a latch receptacle element formed integrally with said tray component and a snap latch element formed integrally with said cover component, said cover component semiconductor chip package pocket opening depending clamping legs and said tray component semiconductor chip open pocket depending support legs and support shelves functioning to fixedly position contained semiconductor chip packages relative to the carrier assembly throughout all possible orientations when said multiple snap latch components secure said cover component to said tray component.

2. The carrier assembly invention defined by claim 1, and wherein said cover component multiple snap latch elements are each comprised of a depending integrally molded boss having a tip and of a pair of spaced-apart depending integrally molded latch bars, said latch bars each developing induced tensile and compression forces when engaged with a respective one of said tray component latch receptacle elements.

3. The carrier assembly invention defined by claim 2, and wherein each said boss is aligned with an integrally molded recess on the body deck of the said cover component to receive said boss tip to thereby permit stacking another said cover component.

4. The carrier assembly invention defined by claim 2, and wherein said tray component latch receptacle elements each have a tapered retention surface, wherein said latch bars each have a tapered retention surface, and wherein said latch receptacle element tapered retention surfaces complement and contact said latch bar tapered retention surfaces when said cover component co-operates with said tray component.

5. The carrier assembly invention defined by claim 1, and wherein said tray component has a top side provided with an integrally molded peripheral recess and an under side provided with an integrally molded downwardly extending projection such that when a pair of trays are stacked the downwardly extending peripheral projection of one tray is received in the peripheral recess formed on the top side of the adjacent tray.

6. The carrier assembly invention defined by claim 5, and wherein said cover component has a top side provided with an integrally molded peripheral recess and a bottom side provided with an integrally molded downwardly depending extending projection such that when said cover component is attached to said tray component to form said carrier assembly said cover component downwardly extending projection is received in said tray component peripheral recess and when a pair of carrier assemblies are stacked said tray component downwardly depending extending projection is received in said cover component peripheral recess.

7. The carrier assembly invention defined by claim 5, and wherein said cover component has a bottom side provided with an integrally molded downwardly depending extending projection such that when said cover component is attached to said tray component to form said carrier assembly said cover component downwardly depending extending projection is received in said tray component peripheral recess.

8. In a carrier assembly for containment of semiconductor chip packages during manufacturing and testing operations, a cover component having a tray-orienting chamfer and a tray-orienting scallop, having multiple semiconductor chip package pocket openings that are positioned to register with the package open pockets of a co-operating carrier tray component, and having multiple integrally formed snap latch elements are each comprised of a depending integrally molded boss and of a pair of spaced-apart depending integrally molded latch bars for securing the cover component to a co-operating carrier tray component, each said integrally molded boss being provided with an integrally molded recess and with an integrally molded lower extreme having a configuration that is complementary to the configuration of said integrally molded recess to thereby facilitate subsequent separate stacking of cover components only.

\* \* \* \* \*